US011439044B1

(12) United States Patent
Osterkamp et al.

(10) Patent No.: US 11,439,044 B1
(45) Date of Patent: Sep. 6, 2022

(54) HEAT RECOVERY FROM DATA CENTER COOLING SYSTEM

(71) Applicant: UIPCO, LLC, San Antonio, TX (US)

(72) Inventors: Bryan J. Osterkamp, New Braunfels, TX (US); Ryan Thomas Russell, San Antonio, TX (US); Nathan Lee Post, San Antonio, TX (US); William Preston Culbertson, II, San Antonio, TX (US); Courtney St. Martin, Roswell, GA (US); Ashley Raine Philbrick, San Antonio, TX (US)

(73) Assignee: United Services Automobile Association (USAA), San Antonio, TX (US)

(*) Notice: Subject to any disclaimer, the term of this patent is extended or adjusted under 35 U.S.C. 154(b) by 425 days.

(21) Appl. No.: 16/591,812

(22) Filed: Oct. 3, 2019

Related U.S. Application Data

(60) Provisional application No. 62/786,643, filed on Dec. 31, 2018.

(51) Int. Cl.
  *H05K 7/20* (2006.01)
  *F26B 23/00* (2006.01)
  *F24F 3/14* (2006.01)
  *F26B 9/06* (2006.01)

(52) U.S. Cl.
  CPC .......... *H05K 7/20709* (2013.01); *F24F 3/14* (2013.01); *F26B 9/06* (2013.01); *F26B 23/001* (2013.01); *F24F 2003/144* (2013.01)

(58) Field of Classification Search
  CPC .. H05K 7/20709; F24F 3/14; F24F 2003/144; F26B 9/06; F26B 23/001

USPC .................................................. 34/86
  See application file for complete search history.

(56) References Cited

U.S. PATENT DOCUMENTS

| | | | | |
|---|---|---|---|---|
| 2,249,624 A * | 7/1941 | Bichowsky | ........... | F24F 3/1417 34/473 |
| 2,867,913 A * | 1/1959 | Faucher | .................. | F26B 21/06 236/44 R |
| 4,893,669 A * | 1/1990 | Kashiwada | ............... | F28C 1/04 261/153 |
| 5,546,678 A * | 8/1996 | Dhaemers | ............... | F26B 21/02 34/224 |

(Continued)

FOREIGN PATENT DOCUMENTS

| | | | | |
|---|---|---|---|---|
| CA | 2863649 C | * | 9/2019 | .............. F26B 21/08 |
| EP | 3462117 A1 | * | 4/2019 | .............. F26B 21/08 |
| JP | 6725583 B2 | * | 7/2020 | .............. F26B 21/08 |

*Primary Examiner* — Stephen M Gravini
(74) *Attorney, Agent, or Firm* — Plumsea Law Group, LLC

(57) ABSTRACT

A system to create a dehydrating environment from the waste cooling air from a data center including a drying room above the data center. Waste cooling air dries moisture laden product in the drying room and is returned to the data center. Also, a system to distribute waste cooling air from a data center. The system includes a reservoir tank and a local tank for waste cooling air. Both tanks include insulated walls that assist in maintaining a temperature within the reservoir tank. A reservoir tank blower conveys waste cooling air from the data center into the reservoir tank and pressurizes the interior of the reservoir tank. Pressurized waste cooling air from the data center is delivered from the local tank through the blower when a blower valve is opened.

20 Claims, 6 Drawing Sheets

(56) References Cited

U.S. PATENT DOCUMENTS

| | | | | |
|---|---|---|---|---|
| 5,979,074 | A * | 11/1999 | Brunner | F26B 5/04 |
| | | | | 34/396 |
| 6,308,437 | B1 * | 10/2001 | Villar | A24F 25/02 |
| | | | | 34/535 |
| 6,944,970 | B2 * | 9/2005 | Silverbrook | B41J 15/044 |
| | | | | 34/640 |
| 7,946,056 | B2 * | 5/2011 | Kroll | A45D 20/22 |
| | | | | 34/100 |
| 8,176,649 | B2 * | 5/2012 | Huffman | A47L 11/34 |
| | | | | 34/239 |
| 8,256,135 | B2 * | 9/2012 | Hedman | A01M 19/00 |
| | | | | 34/497 |
| 8,640,360 | B2 * | 2/2014 | Stamm | F24F 3/1405 |
| | | | | 702/182 |
| 9,027,258 | B2 * | 5/2015 | Bellinger | D06F 58/46 |
| | | | | 34/427 |
| 9,970,708 | B2 * | 5/2018 | Zielinski | F26B 3/04 |
| 10,240,867 | B2 * | 3/2019 | Zielinski | F26B 23/04 |
| 10,893,634 | B1 * | 1/2021 | Russell | H05K 7/20836 |
| 10,928,135 | B2 * | 2/2021 | Zielinski | F26B 9/06 |
| 2007/0225863 | A1 * | 9/2007 | Gross | G06Q 50/08 |
| | | | | 700/266 |
| 2021/0289716 | A1 * | 9/2021 | Lokdarshi | A01G 9/249 |

* cited by examiner

HEAT RECOVERY FROM DATA CENTER COOLING SYSTEM

CROSS-REFERENCE TO RELATED APPLICATIONS

This application claims the benefit of U.S. Provisional Patent Application Ser. No. 62/786,643, filed Dec. 31, 2018, for "Heat Recovery From Data Center Cooling System", the entirety of which is hereby incorporated by reference.

TECHNICAL FIELD

The present disclosure generally relates to recovering value from waste cooling air from a data center. In particular, the disclosure relates to creation of a dehydrating environment and to distribution of waste cooling air from a data center.

BACKGROUND

Many businesses require large amounts of computing power and storage for data relating to customers. Banks of computers store data relating to customer purchases, such as model number; warrantee information; service requirements; values, beneficiary information, and distribution information, such as for insurance contracts. Insurance contracts also may require personal information, such as age and health information. Automobile insurance may require collection and maintenance of information relating to the vehicles insured, drivers' safety records, and the like.

Further, almost all types of business relationships require amounts owed and owing, contact information, credit and billing information. These categories of information must be maintained securely. Often, categories of information are kept separately from other categories to improve security. For example, credit card numbers typically are kept separately from other personally-identifiable information. The types of information that must be stored are myriad, and the number of entries for each type is large.

Typically, this equipment is housed in a data center, often a building separate from other buildings. Modern data centers therefore often have large banks of computing units to accommodate manipulation of large amounts of data. Data centers also typically have large storage banks to store the data required to do service customers.

Such equipment typically is maintained at essentially constant temperature in clean air essentially devoid of dust particles and other deleterious materials suspended in the air. Both liquid water and vapor are controlled to preclude shorting of electrical connections in the equipment.

Such computer devices consume a significant amount of power and generate a significant amount of heat. At least a portion of the heat must be removed to avoid overheating the equipment.

There is a need in the art for a system and method that addresses the shortcomings discussed above.

SUMMARY

The present disclosure is directed to systems and methods for recovering value from waste cooling air from a data center.

In one aspect, the disclosure is directed to a system to create a dehydrating environment from the waste cooling air from a data center. The system comprises a drying room disposed above the data center, with at least one air duct placing the drying room in fluid communication with the data center. The air duct conveys waste cooling air from the data center into the drying room.

The drying room includes an interior cavity configured to receive a moisture laden product. The drying room also includes a doorway configured to allow the moisture laden product to enter and exit the drying room. The drying room removes moisture from the moisture laden product by exposing the moisture laden product to the waste cooling air from the data center and conveys moisture laden air from the drying room to an air handling unit through a wet air return duct.

In another aspect, the present disclosure is directed to a system to distribute waste cooling air from a data center. The system includes a reservoir tank configured to receive the waste cooling air from the data center. The reservoir tank includes an insulated wall that assists in maintaining a temperature within the reservoir tank and a reservoir tank blower configured to convey the waste cooling air from the data center into the reservoir tank and to pressurize the interior of the reservoir tank.

The local tank is in fluid communication with the reservoir tank and in fluid communication with a blower via a hose. Pressurized waste cooling air from the data center is delivered from the local tank out of the blower when a blower valve is opened.

Other systems, methods, features, and advantages of the disclosure will be, or will become, apparent to one of ordinary skill in the art upon examination of the following figures and detailed description. It is intended that all such additional systems, methods, features, and advantages be included within this description and this summary, be within the scope of the disclosure, and be protected by the following claims.

BRIEF DESCRIPTION OF THE DRAWINGS

The disclosure can be better understood with reference to the following drawings and description. The components in the figures are not necessarily to scale, emphasis instead being placed upon illustrating the principles of the invention. Moreover, in the figures, like reference numerals designate corresponding parts throughout the different views.

DESCRIPTION OF EMBODIMENTS

Figure 1:
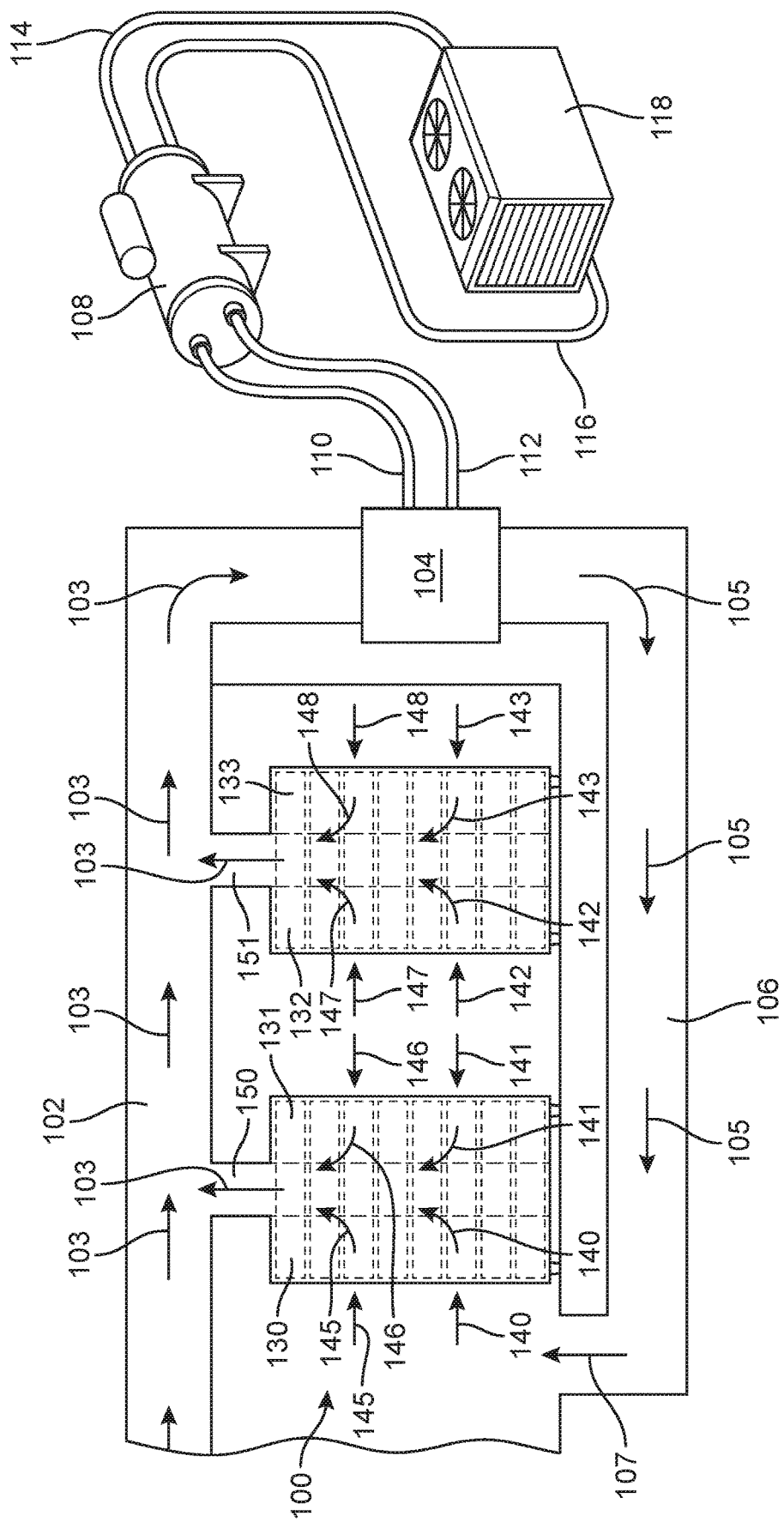
FIG. 1 is a schematic illustration of an embodiment of a data center cooling system.

FIG. 1 illustrates a typical data center 100. In particular, FIG. 1 illustrates an embodiment of cooling air flow in typical data center 100. Data center 100 includes first server rack 130, second server rack 131, third server rack 132, and fourth server rack 133. A data center may have more or fewer server racks, and each server rack may hold one or a plurality of servers (not shown) that typically generate heat that must be removed from the area of the servers.

Thus, cold air from air handling unit 104 flows in the direction of cold circulation arrows 105 through cold air supply duct 106. Cold air flows from duct 106 into the server racks in the direction of cold flow arrow 107. Cold air is flowed over and through first server rack 130 in the direction of first flow arrows 140 and fifth flow arrows 145 into first exhaust duct 150. Similarly, cold air is flowed over and through second server rack 131 in the direction of second flow arrows 141 and sixth flow arrows 146 into first exhaust duct 150.

Cold air also is flowed over and through third server rack 132 in the direction of third flow arrows 142 and sixth flow arrows 146 into second exhaust duct 151. Similarly, cold air is flowed over and through fourth server rack 133 in the direction of fourth flow arrows 143 and eighth flow arrows 148 into second exhaust duct 151.

Thus, exhaust (warmed) air from first exhaust duct 150 and second exhaust duct 151 flows into warm air return duct 102 and in the direction of warm circulation arrows 103 toward air handling unit 104. As illustrated in FIG. 1, air handling unit 104 is configured as an air cooler, as unit 108 connected thereto, as described below, is a chiller.

Cool line 110 from chiller 108 carries cold water or other suitable chilling agent that does not freeze at operating temperatures. Chilling agent reduces the temperature of warm air from warm air return duct 102, which then flows out of air handling unit 104 as cold air for transport to the server racks. Water, in the form of condensate, also typically is removed from the air. Condensate typically is collected as liquid water (not shown) from air handling unit 104. Warmed chilling agent is returned to chiller 108 through hot line 112. A hot line 116 flows from chiller 108 to chiller cooling tower 118 to cool the fluid. Cooled fluid flows through line 116 back to chiller 108. In this way, cooled air can flow through first server rack 130, second server rack 131, third server rack 132, and fourth server rack 133 to cool the servers.

In one aspect, the disclosure is directed to a system to create a dehydrating environment from the waste cooling air from a data center. In some embodiments, the system comprises a drying room disposed above the data center, with at least one air duct placing the drying room in fluid communication with the data center. The air duct conveys waste cooling air from the data center into the drying room.

In embodiments, the drying room includes an interior cavity configured to receive a moisture laden product. The drying room also includes a doorway configured to allow the moisture laden product to enter and exit the drying room. In some embodiments, the drying room removes moisture from the moisture laden product by exposing the moisture laden product to the waste cooling air from the data center and conveys moisture laden air from the drying room to an air handling unit through a wet air return duct.

Figure 2:
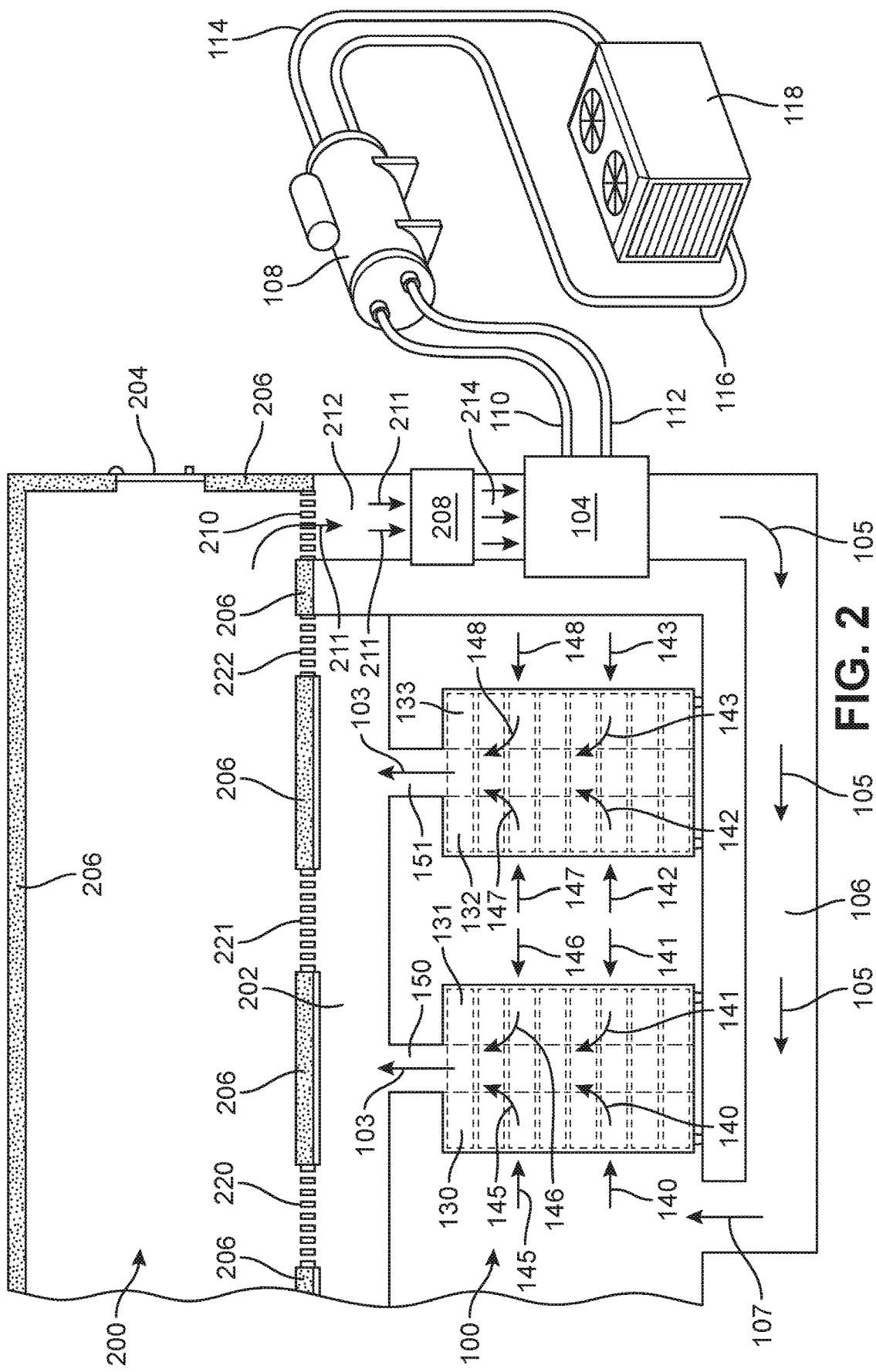
FIG. 2 is a schematic illustration of an embodiment of a drying room system associated with a data center cooling system.

FIG. 2 illustrates an embodiment of such a system. FIG. 2 illustrates a data center, such as the embodiments of a data center depicted in FIG. 1, which includes drying room 200. As illustrated, doorway 204 is available to open to allow goods to be dehydrated (now shown) to be placed in room 200, and to allow dehydrated goods to be removed from drying room 200.

As illustrated in FIG. 1, cold air circulates in the direction of arrows 105 and 107 through first server rack 130, second server rack 131, third server rack 132, and fourth server rack 133. Warmed air then rises in the direction of arrows 103 into warm air duct 202. Warm air duct 202 has first vent 220, second vent 221, and third vent 222. Warmed air rises through first vent 220, second vent 221, and third vent 222 into drying room 200.

Circulation of warm air from warm air duct 202 into drying room 200 is aided by air handling unit 104, which serves to circulate the air. In FIG. 2, warm air flows through drying room 200 and returns to the circulation urged by air handling unit 104 through return vent 210. The air returning through vent 210 will be cooler and more moist than warm air in duct 202.

In some embodiments, air handling unit 104 will be sufficient to cool the circulating air, to remove dust and contaminants, and to remove moisture by condensation of the water vapor in the air before cooling. Air however, handling unit works in combination with chiller 108, cooling tower 118, and associated lines between chiller 108 and air handling unit 104 and between chiller 108 and cooling tower 118. In some embodiments, the system will have supplemental HVAC device 208 disposed between return vent 210 and air handling unit 104.

In some embodiments, supplemental HVAC device 208 will include an air filter. In such embodiments, spent (dirty) air return arrows 211 in spent air return duct 212 indicate flow of spent air to supplemental HVAC device, which in this case is an air filter. Spent (dirty) air 211 will flow through supplemental HVAC device 208, be filtered in supplemental HVAC device 208, and then as clean air, as shown by clean (filtered) air return arrows 214.

In some embodiments, supplemental HVAC device 208 will include a dehumidifier. In such embodiments, spent (wet) air return arrows 211 in spent air return duct 212 indicate flow of spent (wet) air, to supplemental HVAC device 208, which in this case is a dehumidifier. Spent (wet) air 211 will flow through supplemental HVAC device 208, be cooled and have some moisture condensed out of the air in supplemental HVAC device 208, and then as clean (dry) air, as shown by clean (dry) air return arrows 214.

In some embodiments, supplemental HVAC device 208 can include both a filter and a dehumidifier. In such embodiments, spent air 211 would include both dust and moisture, and both would be reduced by supplemental HVAC device 208. In some embodiments, supplemental HVAC device may include other necessary or appropriate air treating devices.

In some embodiments, drying room 200 is insulated, as illustrated at 206. Such insulation may be of any type suitable for the purpose.

Figure 3:
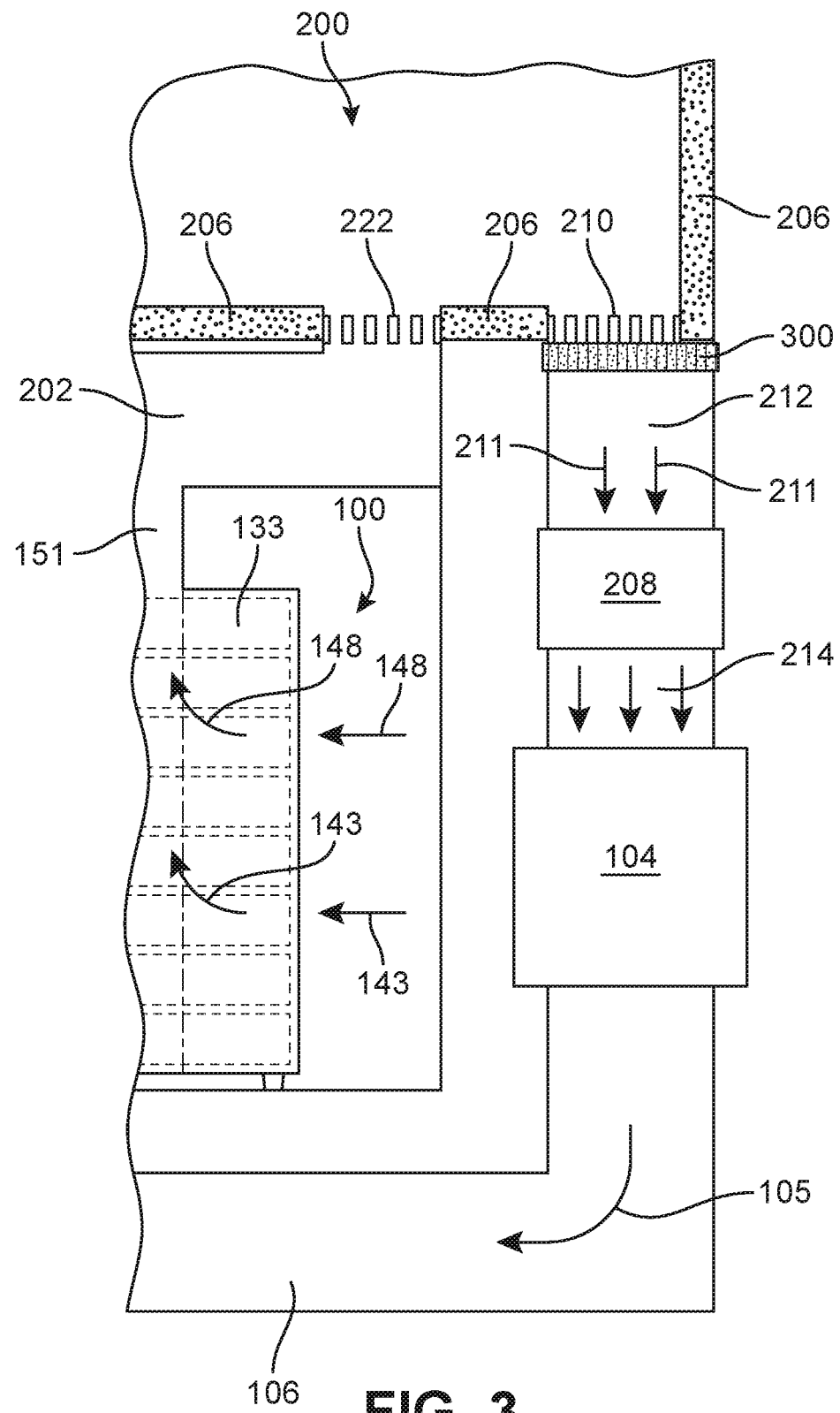
FIG. 3 is a schematic illustration of an embodiment of components associated with a drying room system and a data center cooling system.

In some embodiments, a filter for solids such as particulates and dust may be fixed in the air circulation conduit. FIG. 3 illustrates such an installation after return vent 210 and before supplemental HVAC device 208. Filter 300 is mounted in close proximity to return vent 210. Filter 300 may be mounted in any suitable manner that affords an opportunity to change or clean the filter when it is dirty. For example, filter 300 may be installed so that it may be slid in from a side, thus affording an opportunity to easily remove the filter.

The location within the data center of the various ducts may be chosen to be convenient for any reason, such as ease of construction, ease of access for repair or cleaning, or for decoration, for example. However, because heat rises (a colloquialism expressing the scientific fact that warm air is less dense than cool air), it may be preferable to locate ducts carrying warm air may be most profitably be located above the heat source, or above the server racks. Thus, return duct 102 may be located in the ceiling of the data center. Similarly, it may be convenient to locate return duct 102 in the floor of drying room 200.

In another aspect, the present disclosure is directed to a system to distribute waste cooling air from a data center. The waste cooling air may be used to provide clean heated air to heat an object or to provide flowing heated air, for example, to be used to dry one's hands, hair, or clothing after washing. Other uses also are possible and are known to the skilled practitioner.

The system includes a reservoir tank configured to receive the waste cooling air from the data center. The reservoir tank includes an insulated wall that assists in maintaining a temperature within the reservoir tank and a reservoir tank blower configured to convey the waste cooling air from the data center into the reservoir tank and to pressurize the interior of the reservoir tank.

The local tank is in fluid communication with the reservoir tank and in fluid communication with a blower via a hose. Pressurized waste cooling air from the data center is delivered from the local tank out of the blower when a blower valve is opened.

Figure 4:
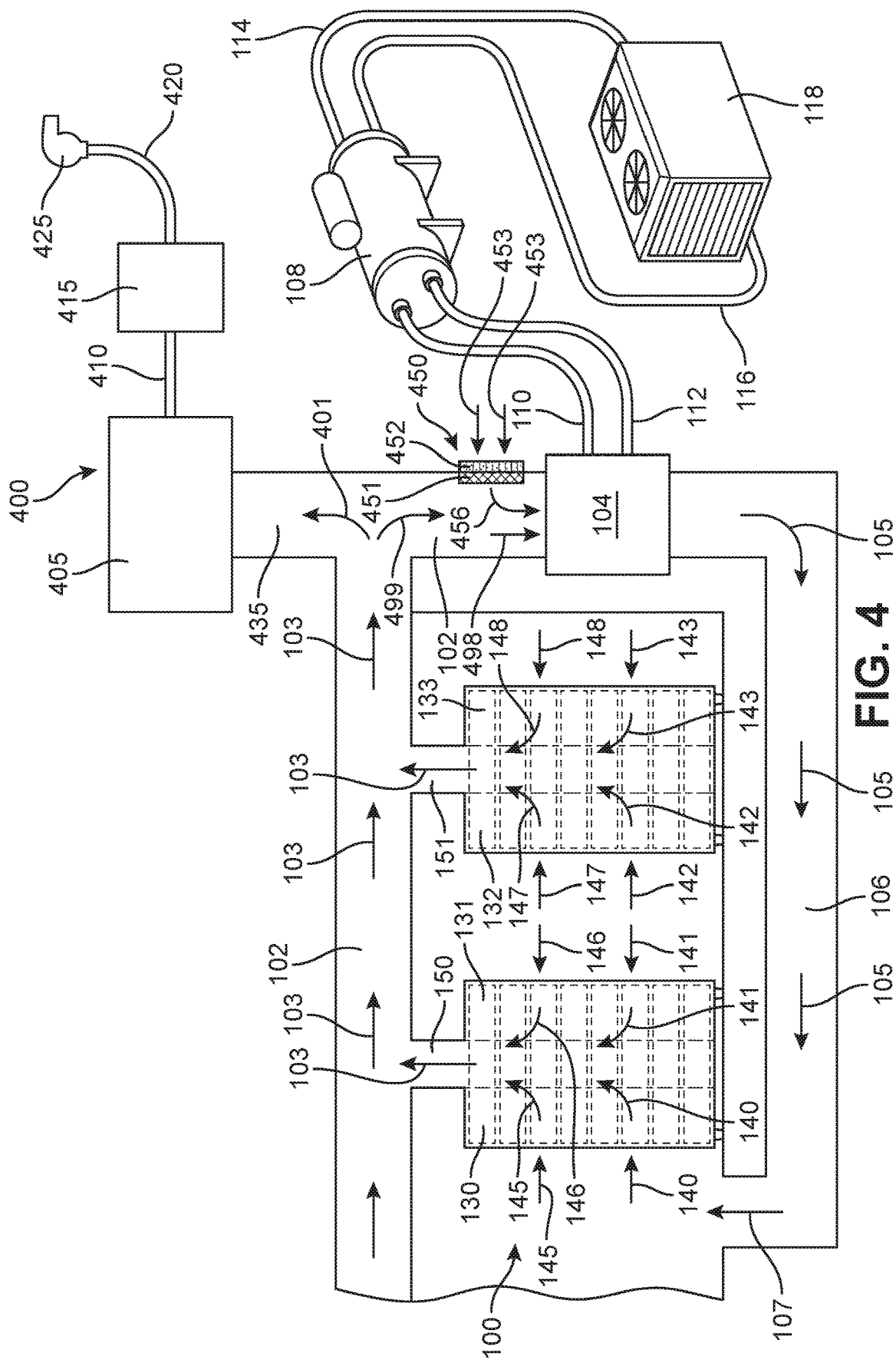
FIG. 4 is a schematic illustration of an embodiment of an air distribution system associated with a data center cooling system.

As illustrated in FIG. 4, air handling unit 104 circulates cold air in the direction of cold circulation arrows 105 and cold flow arrow 107. The air is used to cool first server rack 130, second server rack 131, third server rack 132, and fourth server rack 133. The air then is removed from the racks by way of first exhaust duct 150 and second exhaust duct 151 and then flows in the direction of warm circulation arrows 103. Air handling unit 104 receives cooling medium through cool line 110 from chiller 108 and exhausts heat through hot line 112 to chiller 108.

As illustrated in FIG. 4, warm air circulation is divided into return warm air flow indicated by arrow 499 and waste warm air flow indicated by arrow 401. Return warm air flow 499 returns to air handling unit 104 by way of flow indicated by arrow 498.

In particular, FIG. 4 illustrates air distribution system 400 comprising reservoir tank 405, which receives the waste warm air flow 401 from the data center. Waste warm air flow 401 also may be called waste cooling air. Reservoir tank 405 is in fluid communication with local tank 415 and with blower device 425 through a flexible conduit, such as hose 420. Waste cooling air 401 is delivered through warm air duct 435 to reservoir tank 405, and then flows through connection 410 to local tank 415. For convenience of use, air then flows through hose 420 to blower device 425, which is depicted in FIG. 4 as a hand dryer or hair dryer. Blower device 425 pressurizes the warm air for delivery. Blower device 425 delivers the pressurized warm air for use when valve 512 (see FIG. 5) is opened.

FIG. 4 further illustrates outside air intake system 450. As illustrated, air flows in the direction of flow arrows 453 through air intake valve 452, then through air filter 451. Filtered fresh air 456 then joins return warm air flow 498 as it flows into air handling unit 104.

Figure 5:
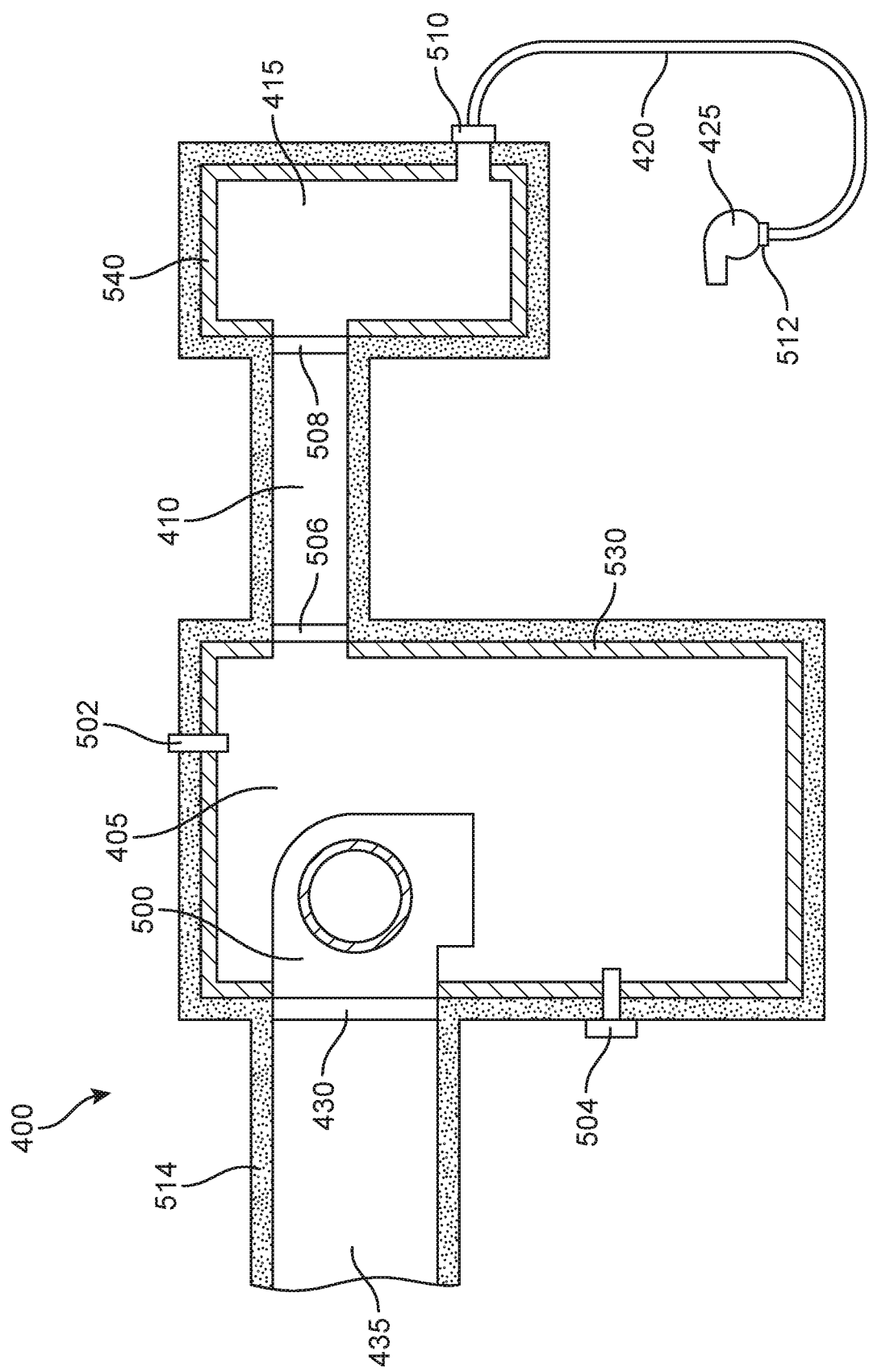
FIG. 5 is a schematic illustration of an embodiment of an air distribution system.

FIG. 5 illustrates additional details of air distribution system 400. As can be seen, the external surfaces of warm air duct 435, reservoir tank 405, connection 410, and local tank 415 are insulated with insulation 514. The insulation assists in maintaining a temperature within the tanks, vessels, and connections. FIG. 5 also illustrates reservoir tank blower 500, which urges warm waste air 401 through warm air duct 435 and through first reservoir tank valve 430 when it is open and into reservoir tank 405. Thus, reservoir tank blower 500 tends to pressurize the air in the air distribution system.

Reservoir tank 405 includes temperature sensor 504 and bleeder valve 502. Air distribution system 400 can open bleeder valve 502 to encourage the introduction of additional waste cooling air 401 through first reservoir tank valve 430 from the data center if a temperature sensed by temperature sensor 504 falls below a predetermined temperature. Because reservoir tank blower 500 pressurizes the air distribution system, bleeder valve 502 also may serve as a pressure relief valve for air distribution system 405.

FIG. 5 further illustrates first high heat capacity wall 530 forming reservoir tank 405. The first high heat capacity wall is configured to help maintain an interior temperature of the reservoir tank. FIG. 5 also illustrates second high heat capacity wall 540 surrounding local tank 415. The second high heat capacity wall is configured to help maintain an interior temperature of the local tank.

As illustrated in FIG. 5, the insulated wall is disposed outwards of the first high heat capacity wall and outwards of the second high heat capacity wall.

Second reservoir tank valve 506 serves to assist in isolating reservoir tank 405 from local connection 410 and local tank 415. This arrangement can minimize flow of undesired compositions from local connection 410, local tank 415, and hose 420 with blower device 425, or can isolate these components from reservoir tank 405 should they develop a leak or otherwise require repair and maintenance. Local tank valve 508 provides the same kind of isolatability for only local tank 415, hose 420, and blower device 425. Similarly, hose connection 510 may be a break-away connection or other similar connection that both allows hose 420 to break away from local tank 415 if it is mishandled and to seal the opening, thus protecting local tank 415. Blower valve 512 enables sealing of hose 420 so that blower device 425 can be removed without affecting the remainder of the system.

Figure 6:
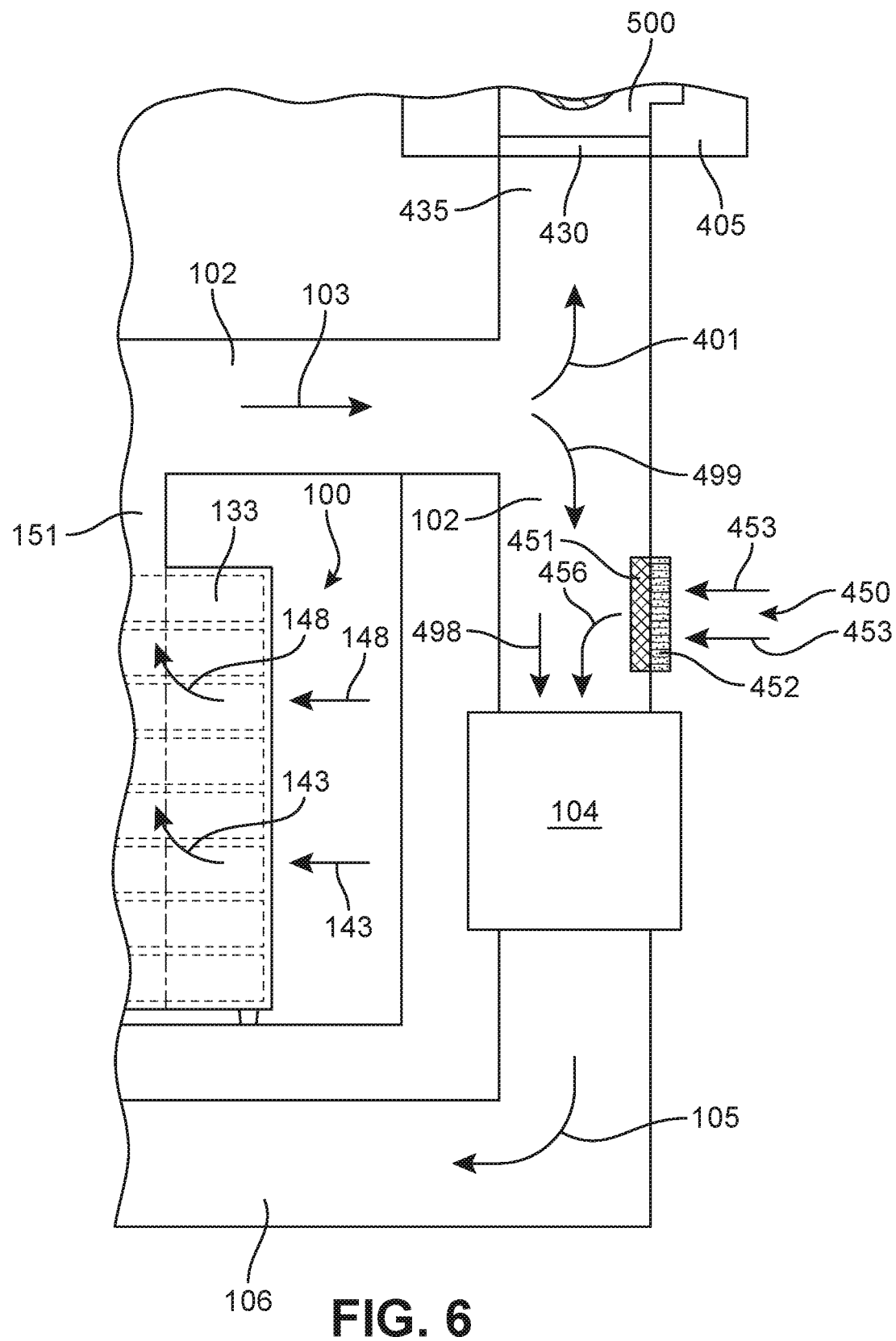
FIG. 6 is a schematic illustration of an embodiment of components associated with an air distribution system and a data center cooling system.

FIG. 6 further illustrates outside air intake system 450. As illustrated, air flows in the direction of flow arrows 453 through air intake valve 452, then through air filter 451. Filtered fresh air 456 then joins return warm air flow 498 from duct 102 as it flows into air handling unit 104.

Outside air intake system 460 is disposed upstream of air handling unit 104. Air intake valve 452 opens to introduce outside air when a sensed pressure drops below a predetermined level. Thus, the data center cooling system maintains a sufficient quantity of air for operation.

While various embodiments have been described, the description is intended to be exemplary, rather than limiting, and it will be apparent to those of ordinary skill in the art that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with, or substituted for, any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

We claim:

1. A system to create a dehydrating environment from waste cooling air from a data center, the system comprising:

a data center, the data center including at least one computer server rack being cooled by airflow from an air handling unit so as to create waste cooling air;
a drying room disposed above the data center, at least one air duct placing the drying room in fluid communication with the data center, the at least one air duct conveying the waste cooling air from the data center into the drying room;
the drying room including an interior cavity configured to receive a moisture laden product;
the drying room including a doorway configured to allow the moisture laden product to enter and exit the drying room;
wherein the drying room removes moisture from the moisture laden product by exposing the moisture laden product to the waste cooling air from the data center;
the drying room including a wet air return duct conveying moisture laden air from the drying room to the air handling unit.

2. The system according to claim 1, further comprising a supplemental HVAC device disposed between the wet air return duct and the air handling unit; the supplemental HVAC device including an air filter and a dehumidifier therein.

3. The system according to claim 1, wherein the drying room is insulated on a ceiling and on a lateral side thereof.

4. The system according to claim 1, wherein air handling unit removes water from air passing through it in the form of condensate.

5. The system according to claim 1, wherein
the at least one air duct is disposed in a ceiling of the data center; and
the at least one air duct is disposed in a floor of the drying room.

6. The system according to claim 1, wherein the wet air return duct includes a filter therein.

7. A system to distribute waste cooling air from a data center, the system comprising:
a data center, the data center including at least one computer server rack generating heat that is being cooled by airflow from an air handling unit so as to create waste cooling air;
a reservoir tank configured to receive the waste cooling air from the data center, the reservoir tank including an insulated wall that assists in maintaining a temperature within the reservoir tank;
the reservoir tank including a reservoir tank blower configured to convey the waste cooling air from the data center into the reservoir tank, and to pressurize an interior of the reservoir tank;
the reservoir tank distributing the waste cooling air to at least one local tank, the local tank being located away from the reservoir tank, a connection placing the local tank in fluid communication with the reservoir tank;
the local tank in fluid communication with a blower via a hose;
wherein pressurized waste cooling air from the data center is delivered from the local tank out of the blower when a blower valve is opened.

8. The system according to claim 7, wherein the reservoir tank includes a high heat capacity wall configured to help maintain an interior temperature of the reservoir tank.

9. The system according to claim 8, wherein the insulated wall is disposed outwards of the high heat capacity wall.

10. The system according to claim 7, wherein the reservoir tank includes a temperature sensor, and a bleeder valve; and wherein the system can open the bleeder valve to encourage introduction of additional waste cooling air from the data center if a sensed temperature by the temperature sensor falls below a predetermined temperature.

11. The system according to claim 7, further including an outside air intake system, the outside air intake system including an air intake valve disposed upstream of an air handling unit; wherein the air intake valve opens to introduce outside air when a sensed pressure drops below a predetermined level.

12. The system according to claim 11, wherein the outside air intake system includes an air filter.

13. A method for distributing waste cooling air from a data center using an air delivery system, the method comprising:
cooling at least one computer server rack that generates heat, the cooling being done by passing airflow from an air handling unit over the computer server rack so as to create waste cooling air;
conveying the waste cooling air from the data center to a reservoir tank;
pressurizing the waste cooling air in the reservoir tank;
distributing the pressurized waste cooling air from the reservoir tank through a connection to at least one local tank separate from the reservoir tank; and
delivering the pressurized waste cooling air from the local tank through a hose to a blower having a valve that delivers pressurized waste cooling air from the hose when the blower valve is open.

14. The method according to claim 13, further comprising maintaining an interior temperature of the reservoir tank by providing the reservoir tank with at least one high heat capacity wall.

15. The method according to claim 13, further comprising maintaining an interior temperature of the local tank by providing the local tank with at least one high heat capacity wall.

16. The method according to claim 13, further comprising opening a bleeder valve in the reservoir tank to encourage introduction of additional waste cooling air from the data center if a temperature sensed by a temperature sensor falls below a predetermined temperature.

17. The method according to claim 13, further comprising opening an air intake valve in an air intake system to introduce outside air when a sensed pressure drops below a predetermined level.

18. The method according to claim 17, further comprising filtering the outside air from the outside air intake system.

19. The method according to claim 13, further comprising immediately stopping air flow if the hose becomes disconnected.

20. The method according to claim 13, further comprising closing at least one valve to isolate a portion of the air delivery system that malfunctions to protect the air quality in the data center.

* * * * *